(12) United States Patent
Bayerer (10) Patent No.: US 8,823,175 B2
(45) Date of Patent: Sep. 2, 2014

(54) RELIABLE AREA JOINTS FOR POWER SEMICONDUCTORS

(75) Inventor: Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/471,898

(22) Filed: May 15, 2012

(65) Prior Publication Data

US 2013/0307156 A1    Nov. 21, 2013

(51) Int. Cl.
*H01L 23/48* (2006.01)

(52) U.S. Cl.
USPC .......................................................... 257/762

(58) Field of Classification Search
USPC .......... 438/612, 614; 257/734, 736, 741, 750, 257/762, 775, 782
See application file for complete search history.

(56) References Cited

U.S. PATENT DOCUMENTS

| | | | |
|---|---|---|---|
| 5,353,195 A | 10/1994 | Fillion et al. | |
| 5,353,498 A | 10/1994 | Fillion et al. | |
| 5,497,033 A | 3/1996 | Fillion et al. | |
| 5,637,922 A | 6/1997 | Fillion et al. | |
| 6,306,680 B1 | 10/2001 | Fillion et al. | |
| 6,812,559 B2 | 11/2004 | Palm et al. | |
| 7,402,457 B2 | 7/2008 | Häse et al. | |
| 2005/0032347 A1* | 2/2005 | Hase et al. | 438/612 |
| 2011/0272826 A1* | 11/2011 | Holst et al. | 257/782 |

FOREIGN PATENT DOCUMENTS

| | | |
|---|---|---|
| DE | 102004019435 A1 | 11/2005 |
| DE | 102004059389 B4 | 2/2012 |

OTHER PUBLICATIONS

Uwe Scheuermann. "Reliability of Planar SKiN Interconnect Technology (Invited)." CIPS, Mar. 2012. pp. 1-8. VDE Verlag GmbH. Offenbach, Germany.
K. Weidner, et al. "Planar Interconnect Technology for Power Module System Integration." CIPS, Mar. 2012. pp. 1-5. VDE Verlag GmbH. Offenbach, Germany.
K. Guth, et al. "New assembly and interconnect technologies for power modules." CIPS, Mar. 2012. pp. 1-5. VDE Verlag GmbH. Offenbach, Germany.

* cited by examiner

*Primary Examiner* — Brook Kebede
(74) *Attorney, Agent, or Firm* — Murphy, Bilak & Homiller, PLLC (57) ABSTRACT

A power semiconductor module includes an electrically insulating substrate, copper metallization disposed on a first side of the substrate and patterned into a die attach region and a plurality of contact regions, and a semiconductor die attached to the die attach region. The die includes an active device region and one or more copper die metallization layers disposed above the active device region. The active device region is disposed closer to the copper metallization than the one or more copper die metallization layers. The copper die metallization layer spaced furthest from the active device region has a contact area extending over a majority of a side of the die facing away from the substrate. The module further includes a copper interconnect metallization connected to the contact area of the die via an aluminum-free area joint and to a first one of the contact regions of the copper metallization.

27 Claims, 10 Drawing Sheets

RELIABLE AREA JOINTS FOR POWER SEMICONDUCTORS

TECHNICAL FIELD

The instant application relates to power semiconductors, and more particularly to reliable area joints for power semiconductors.

BACKGROUND

Power semiconductor die are conventionally attached to a metalized side of a substrate at the backside of the die by a soldered, diffusion soldered or sintered area joint. Electrical connections are typically made to the front side of the die facing away from the substrate by heavy Al-wire bonding or heavy Cu-wire bonding. Double-sided area joints have been used for example in double-sided cooling assemblies and from older thyristor and rectifier module designs, where metal clips are joined to the front side by soldering. The clip soldering method is also used in some discrete low voltage power MOSFET (metal-oxide-semiconductor field-effect transistor) packages. In so-called planar interconnect technology, the structure has an insulating layer on the carriers/substrates and a conductor pattern on top of the insulating layer. In other double-sided area joint approaches, a flexible board is used to provide an area contact to the front side of the die instead of a wire bond connection.

In each case, conventional area contacts suffer from a mismatch in the thermal expansion of the metal that is joined to the die and the semiconductor material. The mismatch causes thermo-mechanical stress in the joint partners and in the interface material. In any case high stress at the end of the edges and corners of the area joints causes delamination. With soldered area-contacts, the stress cracks the solder layer during power cycling or thermal cycling. The crack propagates from the edge to the center within the solder. In some planar interconnect technologies, copper is grown directly on the die metallization which is Al, AlSi or AlCu or AlCuSi. An interface metal layer is usually applied below the copper layer to be grown. The interface layer is rather thin and in the range of a few 100 nm. The weak layer for delamination is the Al or Al alloy die metallization. The cracks start at the edges and corners at the Al surface and moves toward the center within the Al die metallization layer. In the case of a sintered connection to the die Al die metallization, the crack starts at the edges and corners at the surface of the sintered layer and moves down into the Al die metallization layer and stays in the Al metallization propagating toward the center. Even though some conventional planar interconnect technologies have eliminated the weak soft solder in the area contact with the die, the lifetime of these structures is limited by this area joint because of the use of standard Al die metallization which is the weakest point in the area joint region.

SUMMARY

The embodiments described herein provide an Al-free area joint between a last copper metallization layer of a semiconductor die and a copper interconnect metallization which electrically connects the last copper metallization layer of the die to a patterned copper metallization disposed on an electrically insulating substrate. As used herein, the term 'copper' refers to pure copper or copper alloys i.e. metal alloys that have copper as a principal component. The copper interconnect metallization can be part of e.g. another substrate, a planar interconnect structure, a flexible or rigid board, or a clip which forms an Al-free area joint with the last copper metallization layer of the die.

According to an embodiment of a power semiconductor module, the module comprises an electrically insulating substrate, copper metallization disposed on a first side of the substrate and patterned into a die attach region and a plurality of contact regions, and a semiconductor die attached to the die attach region of the copper metallization. The die comprises an active device region and one or more copper die metallization layers disposed above the active device region. The active device region is disposed closer to the copper metallization than the one or more copper die metallization layers. The copper die metallization layer spaced furthest from the active device region has a contact area extending over a majority of a side of the die facing away from the substrate. The module further comprises a copper interconnect metallization connected to the contact area of the die via an aluminum-free area joint and to a first one of the contact regions of the copper metallization.

According to an embodiment of a method of assembling a power semiconductor module, the method comprises: providing an electrically insulating substrate and copper metallization disposed on a first side of the substrate and patterned into a die attach region and a plurality of contact regions; attaching a semiconductor die to the die attach region of the copper metallization, the die comprising an active device region and one or more copper die metallization layers disposed above the active device region, the active device region disposed closer to the copper metallization than the one or more copper die metallization layers, the copper die metallization layer spaced furthest from the active device region having a contact area extending over a majority of a side of the die facing away from the substrate; and connecting a copper interconnect metallization to the contact area of the die via an aluminum-free area joint and to a first one of the contact regions of the copper metallization.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
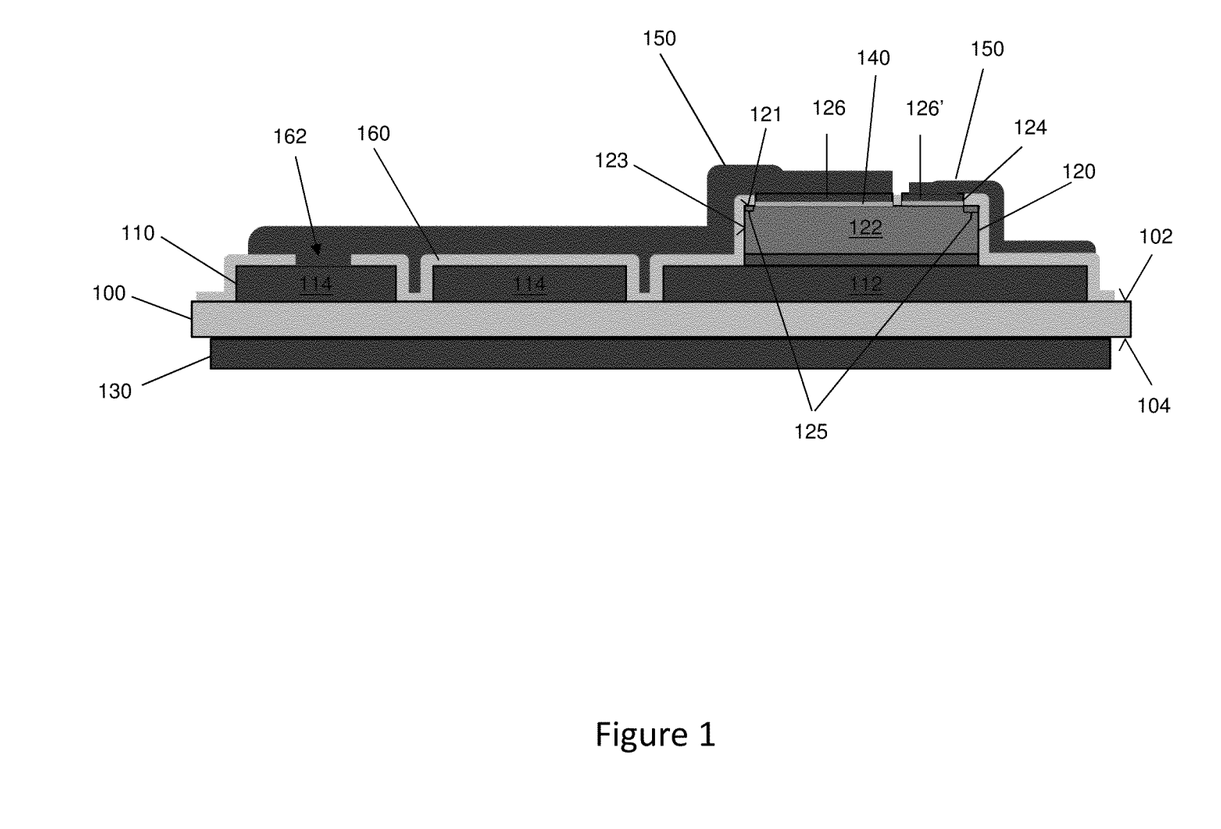
FIG. 1 illustrates a cross-sectional view of a power module with an Al-free area joint between a last copper metallization layer of a semiconductor die and a copper interconnect metallization implemented as part of a planar interconnect structure.

FIG. 1 illustrates an embodiment of a power module that includes an electrically insulating substrate 100, copper metallization 110 disposed on a first side 102 of the substrate 100 and patterned into a die attach region 112 and a plurality of contact regions 114, and a semiconductor die 120 attached to the die attach region 112 of the copper metallization 110. For ease of illustration a single die 120 is in-view in FIG. 1, however the power module may include more than one die 120 to form e.g. a power circuit. The opposing second side 104 of the substrate 100 can also copper metallization 130 disposed thereon for attachment e.g. to a heat sink (not shown). The substrate 100 can be any suitable substrate or carrier with a metalized side 110 that forms electrical connections to the die 120. For example, the substrate 100 can be a direct copper bonded (DCB) substrate, an active metal brazed (AMB) substrate, a board such as a circuit board with a metalized side, a lead frame, etc.

In each case, the semiconductor die 120 includes an active device region 122 and one or more copper die metallization layers 124 disposed above the active device region 122. The active device region 122 is disposed closer to the copper metallization 110 on the substrate 100 than the one or more copper die metallization layers 124. The copper die metallization layer 124 spaced furthest from the active device region 122, also referred to herein as the last copper die metallization layer, has one or more contact areas 126 collectively extending over a majority of a side 121 of the die 120 facing away from the substrate 100. A thin interface metallization 140 having a thickness of less than 3 µm, e.g. a few 100 nm, can be provided between the last copper die metallization layer 124 and the semiconductor material of the die 120 to achieve adherence and a barrier against Cu diffusion into the semiconductor material. For example, titanium nitride (TiN), tantalum nitride (TaN) or titanium zirconium nitride (TiZrN) can be as a Cu diffusion barrier. In one embodiment, any thin interface metal 140 is provided before the last copper die metallization layer 124 is formed. As such, the contact area 126 provided by the last copper die metallization layer 124 has the mechanical strength of Cu throughout the whole area contact structure. Optional interface or barrier metals 140 are chosen to have higher mechanical strength than the last copper die metallization layer 124 to maintain superior joint integrity for the power module.

The power module further includes a copper interconnect metallization 150 connected to each Cu contact area 126 of the die 120 via an aluminum-free area joint and to each contact region 114 of the copper metallization 110 on the substrate 100. The die 120 may be a power transistor such as a power MOSFET, an IGBT (insulated gate bipolar transistor),or a JFET (junction field effect transistor) and therefore have a source connected to the die attach region 112 of the substrate copper metallization 110. Any power semiconductor material, e.g. silicon, SiC, GaN, etc. can be used. Also lateral power devices like a power HEMT (high electron mobility transistor) in GaN technology can be used. Such a device would have three copper interconnects on top, i.e. source, drain and gate control terminals. The control terminals are connected in the same way. In another example, the last copper die metallization layer 124 at the opposing side 121 of the die 120 can be patterned into a power (drain) contact area 126 and an input (gate) contact area 126' and with the source connected to the die attach region 112 of the substrate copper metallization 110. In other embodiments, the die 120 may be a power diode with the anode (cathode) connected to the die attach region 112 on the substrate 100 and the last copper die metallization layer 124 forming the cathode (anode) contact area.

In each case, electrical connections are made to each contact area 126 patterned into the last copper die metallization layer 124 through respective area joints with the copper interconnect metallization 150. Bonding wires are not used between the last copper die metallization layer 124 and the copper interconnect metallization 150. Each area joint between the last copper die metallization layer 124 and the copper interconnect metallization 150 is Al-free, meaning that the area joints do not contain Al or an Al alloy. Excluding Al from these area joints improves joint reliability when Cu is used for the die metallization 124 instead of Al. Cu is harder than Al, and therefore eliminates or at least reduces crack propagation from the area joint into the die metallization 124 when Al is excluded from the area joints.

In the embodiment shown in FIG. 1, the copper interconnect metallization 150 is part of a planar interconnect structure which also includes an insulating layer 160 conformably disposed on the substrate 100, the copper metallization 110 on the substrate 100, and lateral sides 123 and periphery 125 of the side 121 of the die 120 facing away from the substrate 100. The insulating layer 160 has an opening 162 over each contact region 114 of the copper metallization 110 disposed on the substrate 100 so that the copper interconnect metallization 150 can be connected to the contact regions 114 through the respective openings 162 in the insulating layer 160 (some openings are out of view in FIG. 1). The copper interconnect metallization 150 is formed on the insulating layer 160 and conforms to a surface topography of the insulating layer 160 and of the die 120.

Figure 2A:
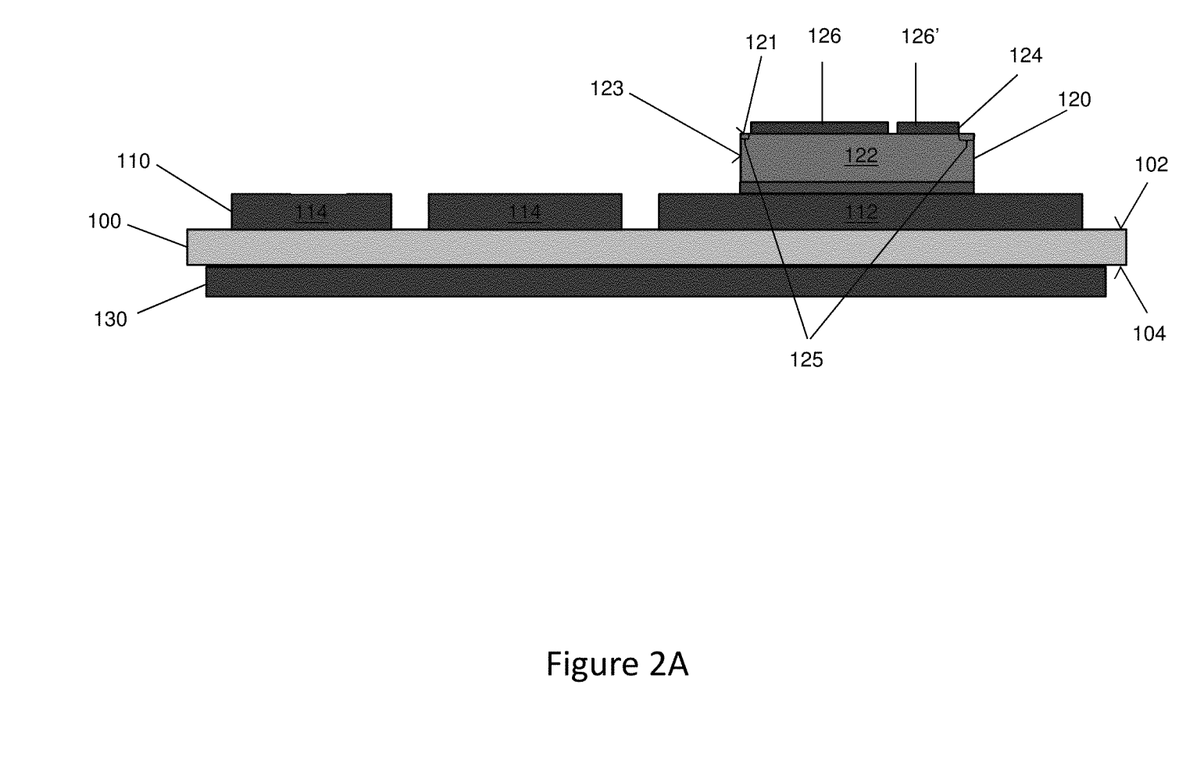
FIGS. 2A through 2E illustrate cross-sectional views of the power module of FIG. 1 during different process steps of an embodiment of a method of manufacturing the module.
Figure 2B:
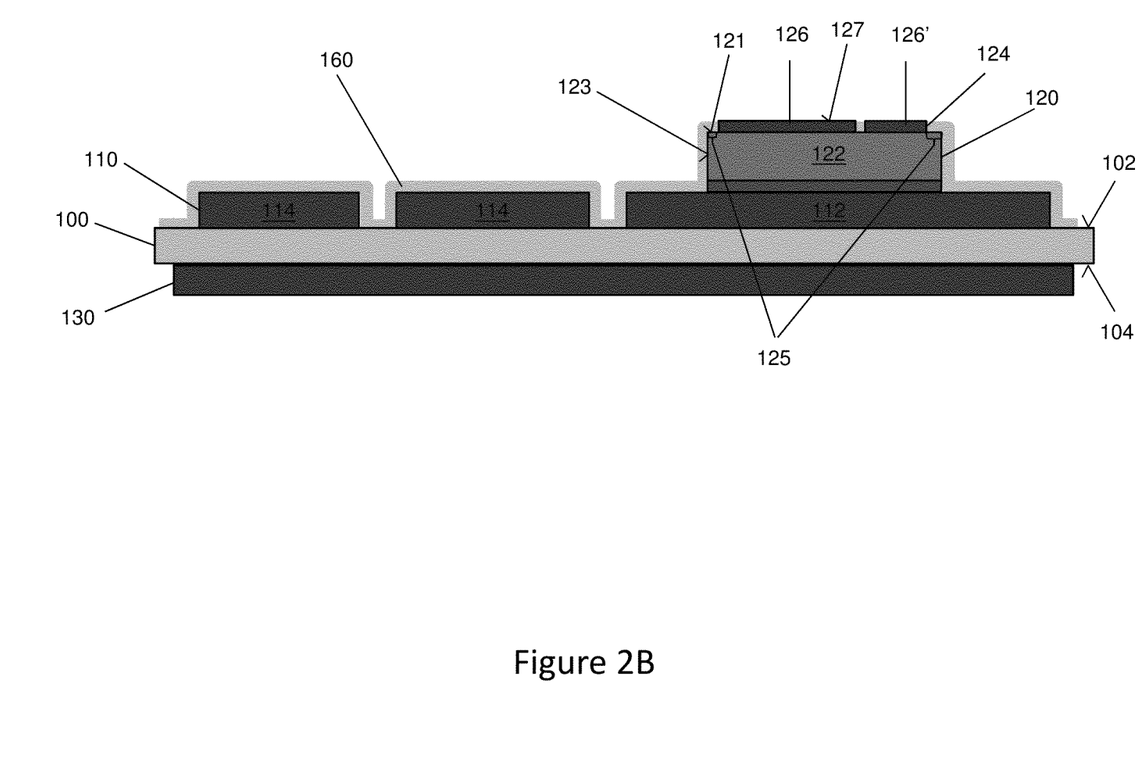
Figure 2C:
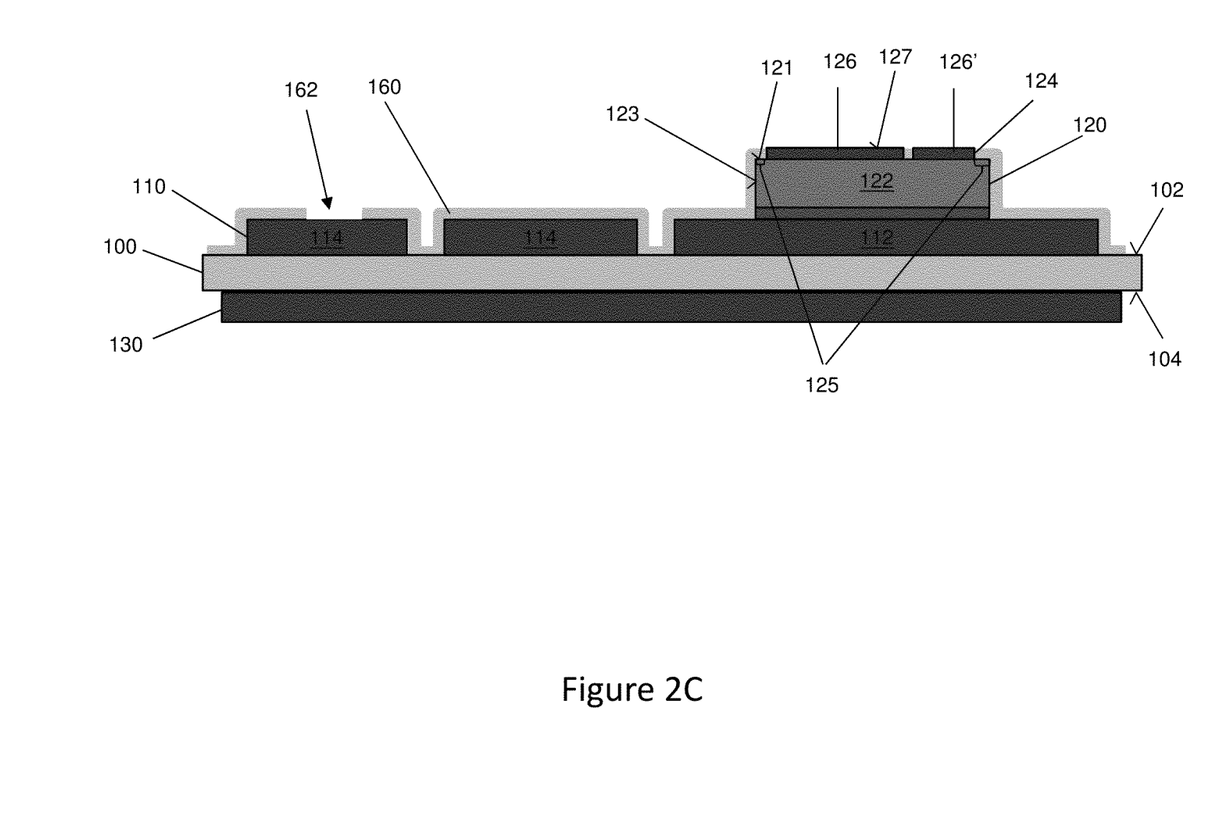

FIGS. 2A through 2E illustrate an embodiment of a method of manufacturing the power module shown in FIG. 1. The die 120 is attached to the copper metallization 110 of the substrate 100 with the last copper die metallization layer 124 facing away from the substrate 100 after attachment as shown in FIG. 2A. The conformal insulating layer 160 is then formed on the substrate 100, the copper metallization 110 on the substrate 100, and lateral sides 123 and periphery 125 of the side 121 of the die 120 facing away from the substrate 100 as shown in FIG. 2B. The insulating layer 160 does not overlap more than 5 µm of the top (exposed) side 127 of the last copper die metallization layer 124 according to this embodiment. An opening 162 is formed through the insulating layer 160 over each contact region 114 of the substrate copper metallization 110 as shown in FIG. 2C (some openings are out of view in FIG. 2C). For example, the insulating layer 160 can be laminated over the whole structure and then opened in certain areas. The copper interconnect metallization 150 is then formed on the insulating layer 160 and the last copper metallization layer 124 of the die 120 so that the copper interconnect metallization 150 conforms to a surface topography of the insulating layer 160 and of the die 120, and connects to each applicable contact region 114 of the substrate copper metallization 110 through the corresponding opening 162 in the insulating layer 160.

Figure 2D:
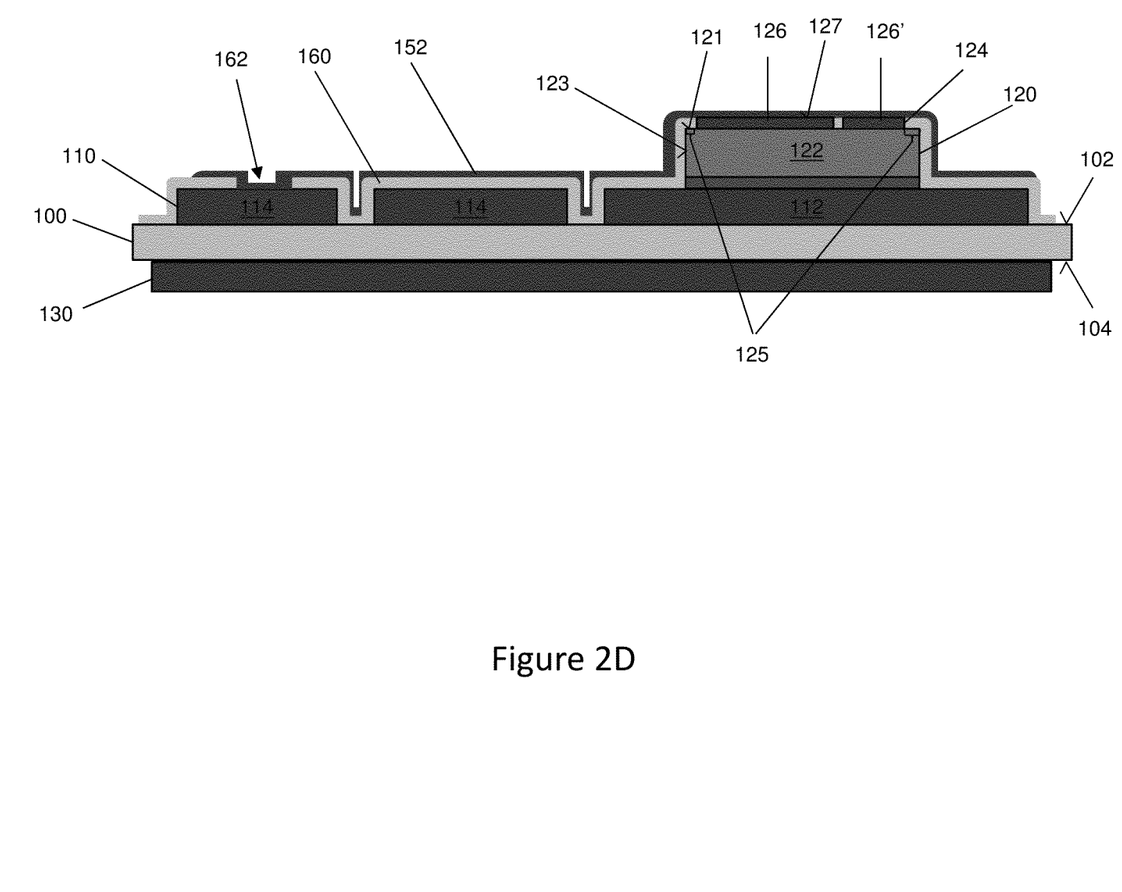
Figure 2E:
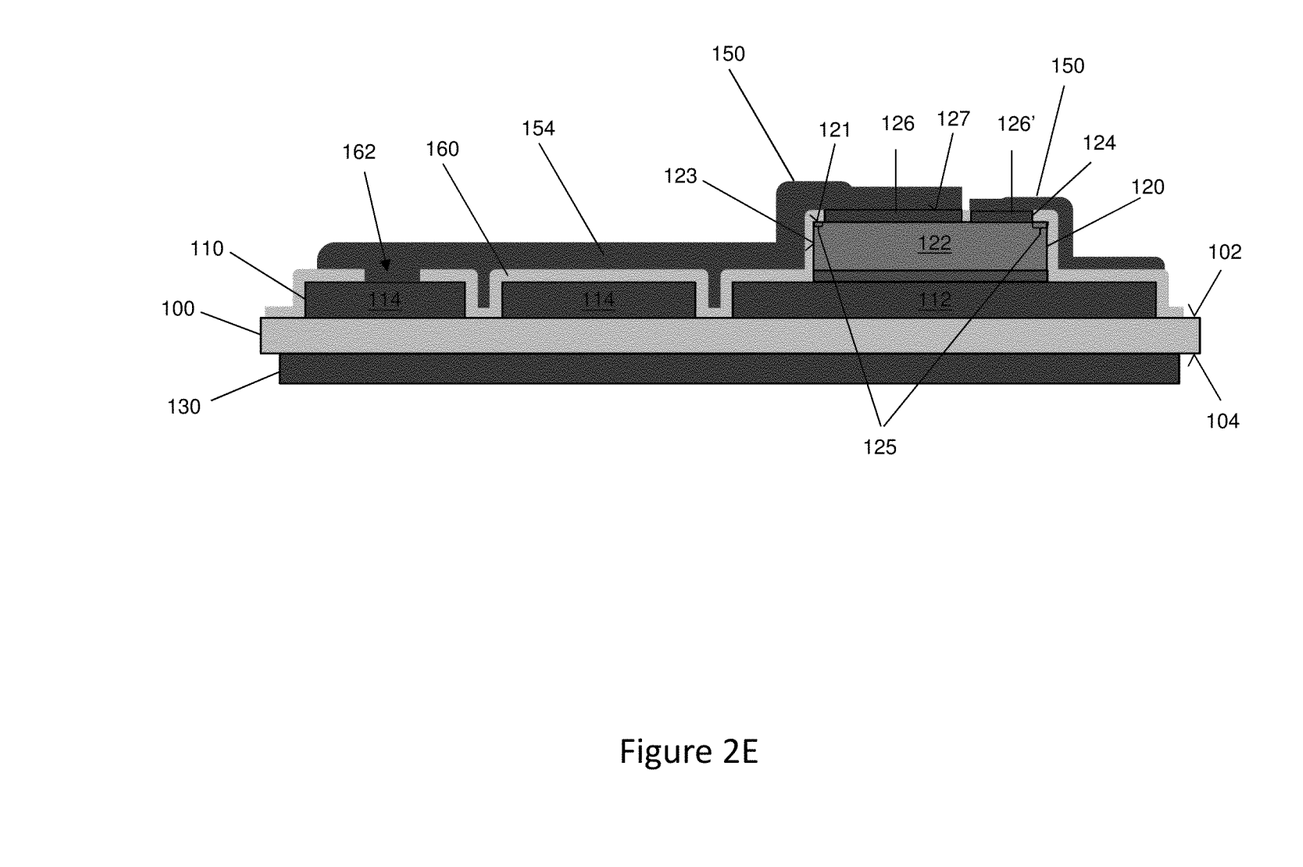

The copper interconnect metallization 152 can be produced by forming a thin copper growth seed layer 152 on the insulating layer 160 and the last copper die metallization layer as shown in FIG. 2D. A thicker layer of copper 154 is then galvanically grown on the thin seed layer 152 as shown in FIG. 2E to produce the copper interconnect metallization 150. Before the thick copper layer 154 is galvanically grown, a photolithography layer (not shown) can be applied and structured to grow the thick copper 154 according to the circuit structure. After the thick copper 154 is grown, the photolithography layer is removed and the seed layer 152 is etched away in the grooves by short etching of the whole copper layers. The copper interconnect metallization 150 is connected to the entire side of the Cu contact area 126 of the die 120 facing away from the substrate 100 according to this embodiment because the insulating layer 160 does not overlap any of the top (exposed) side 127 of the last copper die metallization layer 124. As such, the Cu contact area 126 of the die 120 can be very thin e.g. 1 μm or less thick.

Figure 3:
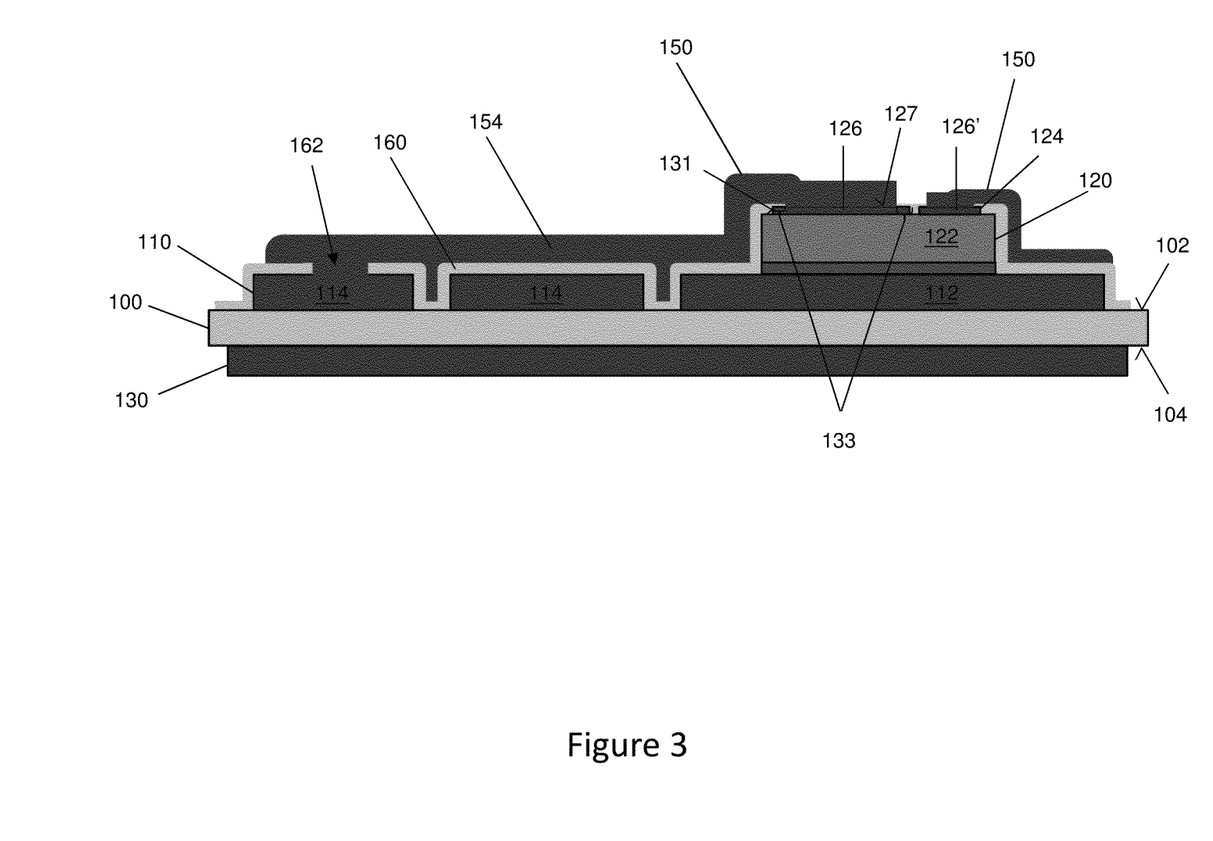
FIG. 3 illustrates a cross-sectional view of a power module with an Al-free area joint between a last copper metallization layer of a semiconductor die and a copper interconnect metallization implemented as part of a planar interconnect structure according to another embodiment.

FIG. 3 illustrates another embodiment of the power module which is similar to the embodiment shown in FIG. 1, however the insulating layer 160 of the planar interconnect structure is disposed on lateral sides 131 and at least a 10 μm periphery 131 of the contact area 126 of the die 120. This way, the copper interconnect metallization 150 is connected to the entire side 127 of the Cu contact area 126 of the die 120 facing away from the substrate 100 except in the periphery 133 of the contact area 126. According to this embodiment, the last copper die metallization layer 124 has a thickness of at least 10 μm.

In general, the thickness of the last copper die metallization layer 124 can range from 1 μm or less to 50 μm and the thickness of the copper interconnect metallization 150 can range from 20 μm to 300 μm when the copper interconnect metallization 150 is part of a planar interconnect structure as illustrated in FIGS. 1-3.

Figure 4:
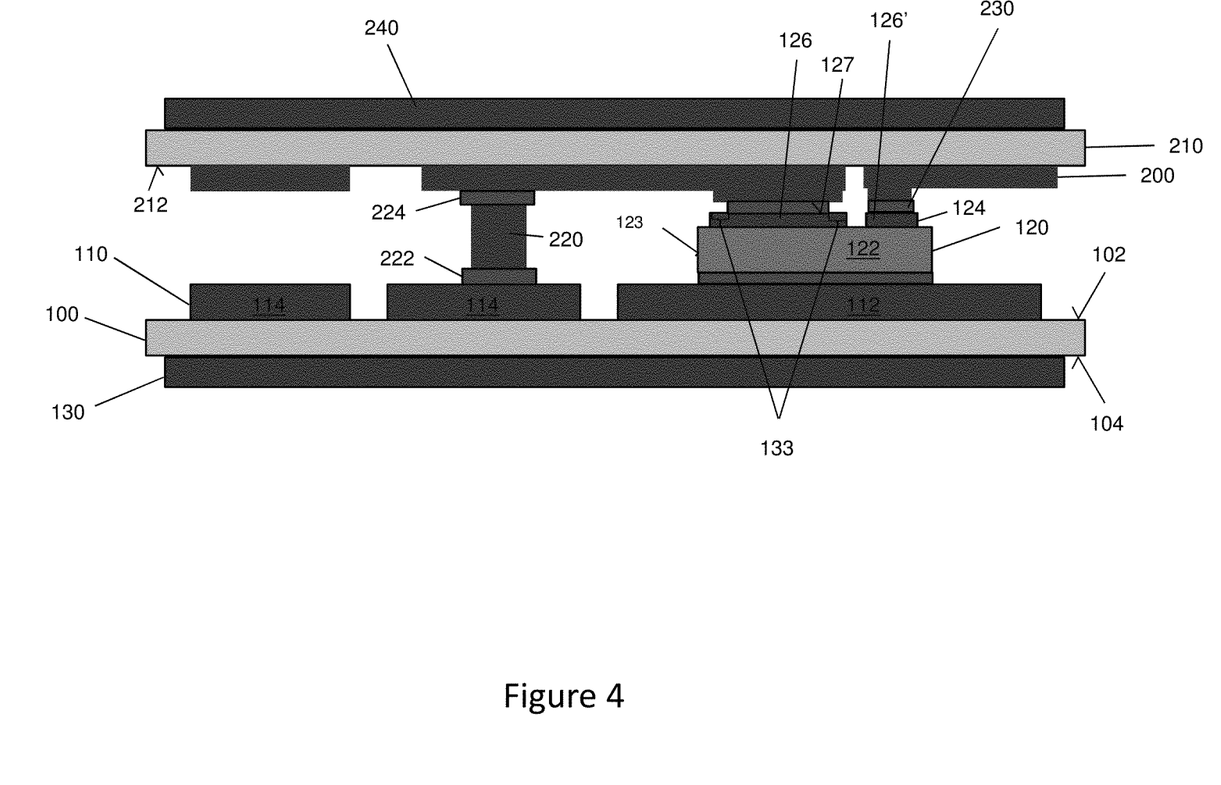
FIG. 4 illustrates a cross-sectional view of a power module with an Al-free area joint between a last copper metallization layer of a semiconductor die and a copper interconnect metallization implemented as part of a substrate.

FIG. 4 illustrates another embodiment of a power module that includes an electrically insulating substrate 100, copper metallization 110 disposed on a first side 102 of the substrate 100 and patterned into a die attach region 112 and a plurality of contact regions 114, and a semiconductor die 120 attached to the die attach region 112 of the substrate copper metallization 110. The opposing second side 104 of the substrate 100 can also be metalized 130 for attachment e.g. to a heat sink. The substrate 100 can be any suitable substrate or carrier with a metalized side that forms electrical connections to the die. For example, the substrate 100 can be a DCB substrate, an AMB substrate, a board such as a circuit board with a metalized side, a lead frame, etc. as previously described herein. The semiconductor die 120 includes an active device region 122 and one or more copper die metallization layers 124 disposed above the active device region 122 also as previously described herein.

The power module further includes a copper interconnect metallization 200 connected to each contact area 126 of the last copper die metallization layer 124 via an aluminum-free area joint and to each corresponding contact region 114 of the substrate copper metallization 110. Electrical connections are made to each contact area 126 patterned into the last copper die metallization layer 124 through respective area joints with the copper interconnect metallization 200. Bonding wires are not used between the last copper die metallization layer 124 and the copper interconnect metallization 200. The area joints between the last copper die metallization layer 124 and the copper interconnect metallization 200 are Al-free as previously described herein. The copper interconnect metallization 200 is disposed on a 212 side of another substrate 210 facing the die 120 according to this embodiment. The other substrate 210 can be a DCB substrate, an AMB substrate, a board such as a circuit board with a metalized side, a lead frame, etc. The copper interconnect metallization 200 disposed on the other substrate 210 is connected to the each corresponding contact region 114 of the substrate copper metallization 110 by a respective copper via 220 which is diffusion soldered or sintered 222 to the substrate contact region 114 at a first end and diffusion soldered or sintered 224 to the copper interconnect metallization 200 at an opposing second end.

The copper interconnect metallization 200 is connected to the last copper die metallization layer 124 via an aluminum-free diffusion soldered or sintered interface 230. For diffusion soldered connections, bare copper or Ag plated copper can be used to form the connection interface 230. For sintered connections, a plated Ag layer or Ni/Au or Ni/Pd layer can be used to form the connection interface 230. In such a sintered structure, the weakest layer is the sintered silver layer 230. Therefore the sintering process can be performed in a way that the porosity is less than 12% within the sintered layer 230. Even though the strength of the diffusion soldered or sintered interface 230 is less than that of bare copper it is improved significantly by eliminating Al or Al alloy from the area joint.

The copper interconnect metallization 200 is connected to the entire side 127 of each corresponding Cu contact area 126 of the die 120 except for at least a 10 μm outer periphery 133 of the contact area 126. As such, the copper interconnect metallization 200 has some distance (spacing) to the edge of the Cu contact area 126 of the die 120. The spacing accounts for the dimensional tolerances associated with placing the second substrate 210 on the first substrate 100, accounting for misalignment. The other side of the additional substrate 210 can also be metalized 240. The thickness of the last copper die metallization layer 124 can range from 5 μm or less to 50 μm and the thickness of the copper interconnect metallization 200 can range from 20 μm to 600 μm according to the embodiment shown in FIG. 4.

Figure 5:
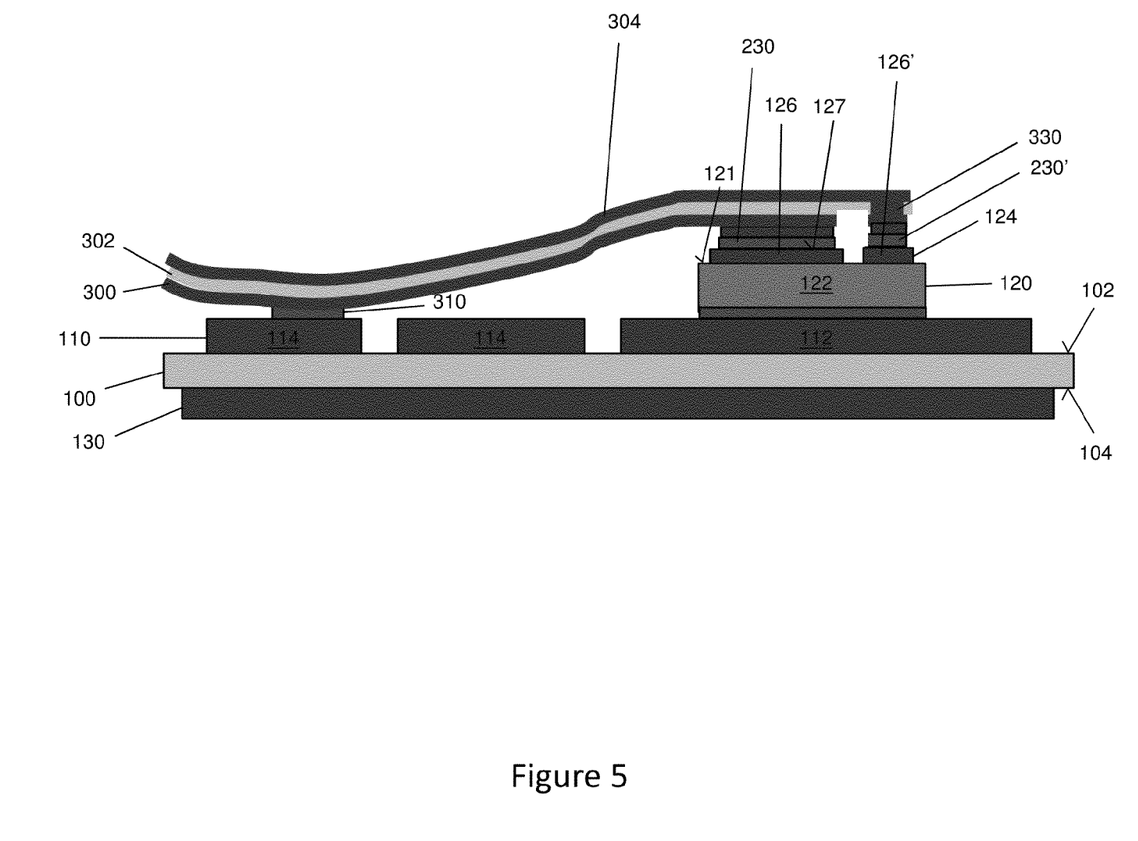
FIG. 5 illustrates a cross-sectional view of a power module with an Al-free area joint between a last copper metallization layer of a semiconductor die and a copper interconnect metallization implemented as part of a flexible board.

FIG. 5 illustrates another embodiment of the power module which is similar to the embodiment shown in FIG. 4, however the additional substrate on which the copper interconnect metallization 302 is disposed is a flexible electrically insulating board 302. The insulating board 302 is flexible and non-planar. As such, the copper interconnect metallization 200 is connected to each corresponding contact region 114 of the substrate copper metallization 110 by a diffusion soldered or sintered interface 310 without an intermediary Cu via. The area joint connection between the copper interconnect metallization 200 and each corresponding contact area 126 of the last copper die metallization layer 124 is the same as in FIG. 4. If an additional Cu contact area 126' is patterned into the last copper die metallization layer 124 e.g. in the case of a transistor die as previously described herein, a copper interconnect metallization 304 can be formed on the top side of the flexible board insulating layer 302 and connected to the additional Cu contact area 126' of the die 120 by a conductive Cu via 330 extending through the flexible board insulating layer 302.

Figure 6:
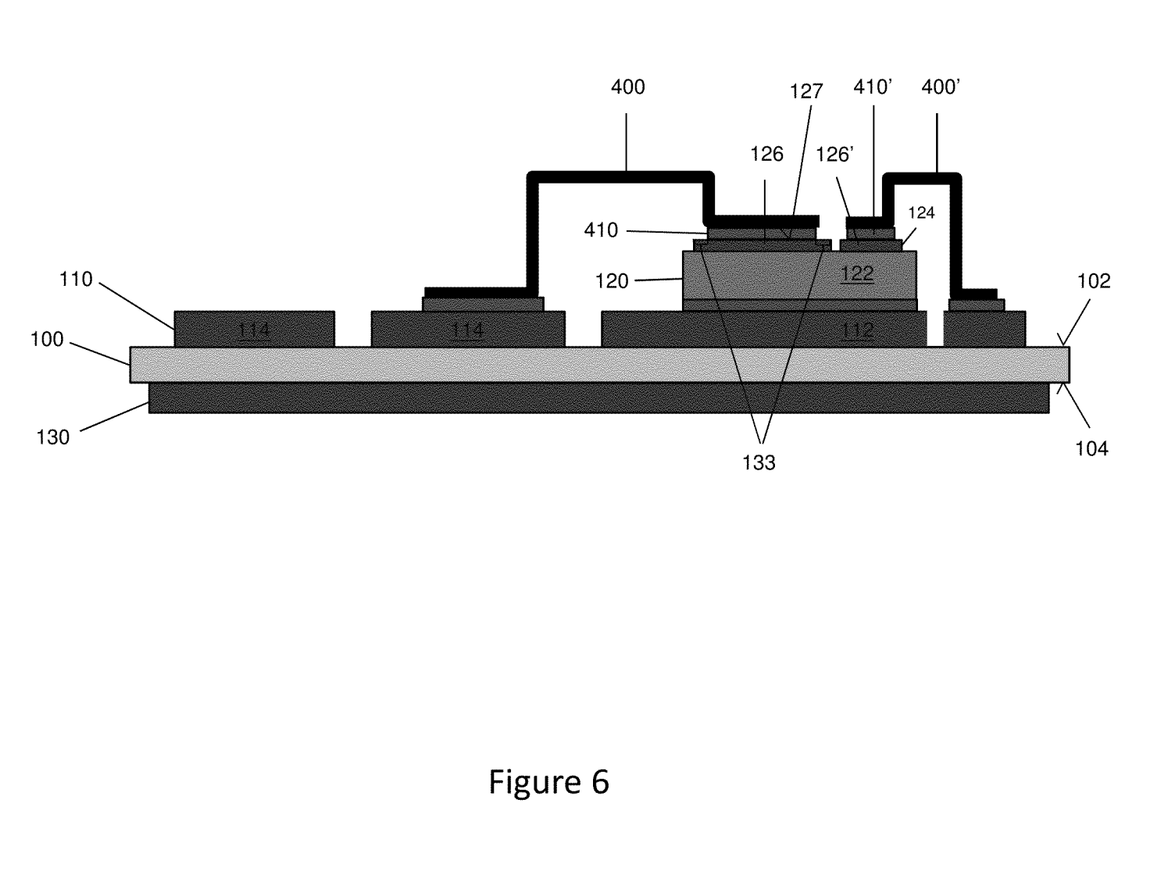
FIG. 6 illustrates a cross-sectional view of a power module with an Al-free area joint between a last copper metallization layer of a semiconductor die and a copper interconnect metallization implemented as part of a clip.

FIG. 6 illustrates yet another embodiment of a power module that includes an electrically insulating substrate 100, copper metallization 110 disposed on a first side 102 of the substrate 100 and patterned into a die attach region 112 and a plurality of contact regions 114, and a semiconductor die 120 attached to the die attach region 112 of the copper metallization 110. The opposing second side 104 of the substrate 100 can also be metalized 130 for attachment e.g. to a heat sink. The substrate 100 can be any suitable substrate or carrier with a metalized side that forms electrical connections to the die. For example, the substrate 100 can be a DCB substrate, an AMB substrate, a board such as a circuit board with a metalized side, a lead frame, etc. as previously described herein. The semiconductor die 120 includes an active device region 122 and one or more copper die metallization layers 124 disposed above the active device region 122 also as previously described herein.

The power module further includes a copper interconnect metallization 400 connected to each corresponding contact area 126 of the last copper die metallization layer 124 via an aluminum-free area joint and to each corresponding contact region 114 of the substrate copper metallization 110. Electrical connections are made to each contact area 126 patterned into the last copper die metallization layer 124 through respective area joints with the copper interconnect metallization 400. Bonding wires are not used between the last copper die metallization layer 124 and the copper interconnect metallization 400. The area joints between the last copper die metallization layer 124 and the copper interconnect metallization 400 are Al-free as previously described herein. The copper interconnect metallization 400 is in the form of one or more clips 400, 400' according to this embodiment. Two Cu clips 400, 400' are shown in FIG. 6. The first Cu clip 400 connects a first contact area 126 patterned into the last copper die metallization layer 124 to a corresponding Cu contact region 114 on the substrate 100. The second Cu clip 400' similarly connects a second contact area 126' patterned into the last copper die metallization layer 124 to a different Cu contact region 114 on the substrate 100. Each Cu clip 400, 400' is connected to the corresponding Cu contact area 126, 126' of the die 120 via an aluminum-free diffusion soldered or sintered interface 410 as previously described herein. Each Cu clip 400, 400' is connected to the entire side 127 of the corresponding Cu contact area 126 of the die 120 except for at least a 10 μm outer periphery 133 of the contact area 126. As such, each Cu clip 400, 400' has some distance (spacing) to the edge of the corresponding Cu contact area 126 of the die 120 as previously described herein. The thickness of the last copper die metallization layer 124 can range from 5 μm or less to 50 μm and the thickness of each Cu clip 400, 400' can range from 200 μm to 2 mm according to the embodiment shown in FIG. 6.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor module, comprising:
   an electrically insulating substrate;
   copper metallization disposed on a first side of the substrate and patterned into a die attach region and a plurality of contact regions;
   a semiconductor die attached to the die attach region of the copper metallization and comprising an active device region and one or more copper die metallization layers disposed above the active device region, the active device region disposed closer to the copper metallization than the one or more copper die metallization layers, the copper die metallization layer spaced furthest from the active device region having a contact area extending over a majority of a side of the die facing away from the substrate; and
   a copper interconnect metallization connected to the contact area of the die via an aluminum-free area joint and to a first one of the contact regions of the copper metallization.

2. A power semiconductor module according to claim 1, further comprising an insulating layer conformably disposed on the substrate, the copper metallization, and lateral sides and periphery of the side of the die facing away from the substrate, the insulating layer having an opening over the first contact region of the copper metallization so that the copper interconnect metallization is connected to the first contact region of the copper metallization through the opening in the insulating layer, and wherein the copper interconnect metallization is disposed on the insulating layer and conforms to a surface topography of the insulating layer and of the die.

3. A power semiconductor module according to claim 2, wherein the insulating layer is disposed on lateral sides and at least a 10 μm periphery of the contact area of the die so that the copper interconnect metallization is connected to the entire side of the contact area of the die facing away from the substrate except in the periphery of the contact area.

4. A power semiconductor module according to claim 3, wherein the copper die metallization layer spaced furthest from the active device region has a thickness of at least 10 μm and the copper interconnect metallization has a thickness of at least 20 μm.

5. A power semiconductor module according to claim 2, wherein the insulating layer is disposed on lateral sides of the contact area of the die and the copper interconnect metallization is connected to the entire side of the contact area of the die facing away from the substrate.

6. A power semiconductor module according to claim 5, wherein the copper die metallization layer spaced furthest from the active device region has a thickness of 1 μm or less and the copper interconnect metallization has a thickness of at least 20 μm.

7. A power semiconductor module according to claim 1, wherein the copper interconnect metallization is disposed on a side of another substrate facing the die and connected to the contact area of the die via an aluminum-free diffusion soldered or sintered interface.

8. A power semiconductor module according to claim 7, wherein the copper interconnect metallization is connected to the first contact region of the copper metallization by a copper via diffusion soldered or sintered to the copper metallization at a first end and diffusion soldered or sintered to the copper interconnect metallization at an opposing second end.

9. A power semiconductor module according to claim 7, wherein the copper interconnect metallization is connected to the entire side of the contact area of the die facing away from the substrate except for at least a 10 μm outer periphery of the contact area.

10. A power semiconductor module according to claim 7, wherein the copper die metallization layer spaced furthest from the active device region has a thickness of at least 5 μm and the copper interconnect metallization has a thickness of at least 20 μm.

11. A power semiconductor module according to claim 1, wherein the copper interconnect metallization is disposed on a side of an insulating board facing the die and connected to the contact area of the die via an aluminum-free diffusion soldered or sintered interface.

12. A power semiconductor module according to claim 11, wherein the copper interconnect metallization is connected to the first contact region of the copper metallization by a diffusion soldered or sintered interface.

13. A power semiconductor module according to claim 11, wherein the copper interconnect metallization is connected to the entire side of the contact area of the die facing away from the substrate except for at least a 10 μm outer periphery of the contact area.

14. A power semiconductor module according to claim 11, wherein the copper die metallization layer spaced furthest from the active device region has a thickness of at least 5 μm and the copper interconnect metallization has a thickness of at least 20 μm.

15. A power semiconductor module according to claim 11, wherein the insulating board is flexible and non-planar.

16. A power semiconductor module according to claim 1, wherein the copper interconnect metallization is a copper clip connected to the contact area of the die via an aluminum-free diffusion soldered or sintered interface.

17. A power semiconductor module according to claim 16, wherein the copper clip is connected to the first contact region of the copper metallization by a diffusion soldered or sintered interface.

18. A power semiconductor module according to claim 16, wherein the copper clip is connected to the entire side of the contact area of the die facing away from the substrate except for at least a 10 μm outer periphery of the contact area.

19. A power semiconductor module according to claim 16, wherein the copper die metallization layer furthest from the active device region has a thickness of at least 5 μm and the copper clip has a thickness of at least 200 μm.

20. A power semiconductor module according to claim 1, wherein the copper die metallization layer spaced furthest from the active device region has the same mechanical strength or a greater mechanical strength than the copper interconnect metallization.

21. A method of assembling a power semiconductor module, comprising:
providing an electrically insulating substrate and copper metallization disposed on a first side of the substrate and patterned into a die attach region and a plurality of contact regions;
attaching a semiconductor die to the die attach region of the copper metallization, the die comprising an active device region and one or more copper die metallization layers disposed above the active device region, the active device region disposed closer to the copper metallization than the one or more copper die metallization layers, the copper die metallization layer spaced furthest from the active device region having a contact area extending over a majority of a side of the die facing away from the substrate; and
connecting a copper interconnect metallization to the contact area of the die via an aluminum-free area joint and to a first one of the contact regions of the copper metallization.

22. A method according to claim 21, further comprising:
forming a conformal insulating layer on the substrate, the copper metallization, and lateral sides and periphery of the side of the die facing away from the substrate;
forming an opening through the insulating layer over the first contact region of the copper metallization; and
forming the copper interconnect metallization on the insulating layer and the contact area of the die so that the copper interconnect metallization conforms to a surface topography of the insulating layer and of the die, and connects to the first contact region of the copper metallization through the opening in the insulating layer.

23. A method according to claim 22, further comprising forming the insulating layer on lateral sides and at least a 10 μm periphery of the contact area of the die so that the copper interconnect metallization is connected to the entire side of the contact area of the die facing away from the substrate except in the periphery of the contact area.

24. A method according to claim 22, further comprising forming the insulating layer on lateral sides of the contact area of the die so that the copper interconnect metallization is connected to the entire side of the contact area of the die facing away from the substrate.

25. A method according to claim 22, wherein forming the copper interconnect metallization on the insulating layer and the contact area of the die comprises:
forming a thin copper growth seed layer on the insulating layer and the contact area of the die, the contact area of the die having a thickness of 1 μm or less; and
galvanically forming copper on the thin seed layer.

26. A method according to claim 21, wherein the copper interconnect metallization is disposed on a side of another substrate facing the die and connected to the contact area of the die via an aluminum-free diffusion soldered or sintered interface.

27. A method according to claim 26, wherein the sintered interface includes a sintered silver layer formed by a sintering process in which a porosity of the sintered silver layer is less than 12%.

* * * * *